United States Patent [19]

Iwashita

[11] Patent Number: 5,394,375
[45] Date of Patent: Feb. 28, 1995

[54] ROW DECODER FOR DRIVING WORD LINE AT A PLURALITY OF POINTS THEREOF

[75] Inventor: Shinichi Iwashita, Tokyo, Japan

[73] Assignee: NEC Corporation, Tokyo, Japan

[21] Appl. No.: 44,052

[22] Filed: Apr. 8, 1993

[30] Foreign Application Priority Data

Apr. 8, 1992 [JP] Japan .................................. 4-115420

[51] Int. Cl.⁶ .............................................. G11C 8/00
[52] U.S. Cl. ........................... 365/230.06; 365/230.01;
365/230.03; 307/412; 326/106
[58] Field of Search ...................... 365/230.06, 230.01,
365/230.03; 307/449, 412

[56] References Cited

U.S. PATENT DOCUMENTS

| | | | |
|---|---|---|---|
| 4,429,374 | 1/1984 | Tanimura | 365/230.06 |
| 4,697,252 | 9/1987 | Furuyama et al. | 365/230.06 |
| 4,777,390 | 10/1988 | Hoshi | 307/449 |
| 5,077,495 | 12/1991 | Torimaru et al. | 307/449 |
| 5,252,863 | 10/1993 | Hatsuda et al. | 365/230.06 X |

OTHER PUBLICATIONS

IEEE Joural of Solid–State Circuits, vol. 24, No. 5, Oct. 1989, pp. 1176–1183, Chou et al, "A 60 NS 16 Mbit DRAM with Minimized Sensing Delay Caused by Bit Line Stray Capacitance".

IEEE Transactions on Computer Aided Design of Integrated Circiuts and Systems, vol. 9, No. 3, Mar. 1990, pp. 236–247, Hoppe et al., "Optimization of High Speed CMOS Logic Circuits with Analytical Models for Signal Delay, Chip Area, and Dynamic Power Dissipation".

Primary Examiner—Eugene R. LaRoche
Assistant Examiner—Huan Hoang
Attorney, Agent, or Firm—Sughrue, Mion, Zinn, Macpeak & Seas

[57] ABSTRACT

A row decoder for a semiconductor memory device is disclosed which includes a plurality of decoding circuits each driving a corresponding one of word lines in response to first and second control signals associated therewith. Each of the decoding circuits includes a first node supplied with the first control signal, a second node supplied with the second control signal, a first transistor connected between the first node and the corresponding word line and turned ON when the second control signal takes an active level, and a second transistor connected between the corresponding word line and a reference potential terminal and turned ON when the second control signal takes an inactive level.

4 Claims, 7 Drawing Sheets

ROW DECODER FOR DRIVING WORD LINE AT A PLURALITY OF POINTS THEREOF

BACKGROUND OF THE INVENTION

The present invention relates to a semiconductor memory device and, more particularly, to a row decoder in a memory device for driving each of word lines at a plurality of points thereof.

As well known in the art, a memory device includes a plurality of word lines, a plurality of bit lines and a plurality of memory cells disposed at intersections of the word and bit lines, respectively. One of the word lines and one of the bit lines are selected and driven to designate one of memory cells. The selection of the word line is performed by a row decoder in response to row address information. Specifically, the row decoder decodes the content of the row address information and selects and drives one word line to an active level.

In accordance with increase in memory capacity, the word line is prolonged to allow a great number of memory cells to be connected thereto. The stray resistance and capacitance of the word line are thereby made large. For this reason, it would take a relatively long period of time to drive the word line to the active level, if the word line would be driven only at one end thereof by the row decoder. The word line is therefore driven at a plurality of points thereof.

Referring to FIG. 1, a memory device according to a prior art includes a memory cell array portion 10 in which four row decoders 2-1 to 2-4 are provided to drive each of word lines W at four points thereof. A memory cell array is therefore divided into five arrays 1-1 to 1-5. Each of the row decoders 2 is disposed between the adjacent memory cell arrays 1, as shown. In this example, row address information consists of nine bits and therefore 512 word lines W0 to W511 are provided. Each of the memory cell arrays 1 has a plurality of bit lines B, and memory cells MC are disposed on the respective intersections of the word and bit lines.

Turning to FIGS. 2, 2b and there is shown a circuit of the row decoder for the word line W0. Each of the decoders 2 includes an inverter 21 and a 3-input NAND gate 22. The NAND gate 22 receives pre-decoded signals P0-P2 generated by a pre-decoder 25. This decoder 25 includes three inverters 254–256 and three 3-input NAND gates 253–255. These NAND gates 253–255 receive selected ones of true and complementary levels of the nine row address signals. In the illustrated example, the true levels of the nine address signals A0–A8 are supplied. Accordingly, when all the address signals A0–A8 takes the high level, each of the pre-decoded signals P0–P2 take the high levels, so that the word line W0 is selected and driven to the active high level. Since the word line W0 is driven at four points thereof, it is charged up to the active high level in a short period of time.

Referring to FIG. 3, there is shown a memory cell array portion 50 according to another prior art. In this memory, the memory cell array portion 50 is divided into 128 blocks 55-0 to 55-127, and each of the blocks 55 therefore includes four word lines. Each of the blocks 55 further includes a main-row decoder 60. Also in this memory, there are provided four sub-row decoders 61-1 to 61-4 to drive each,of the word lines at four points thereof, and a memory cell array is divided into five cell arrays Turning to FIG. 4, which illustrates the block 55-1 in more detail, each of the sub-row decoders 61 includes four 2-input NOR gates 611 to drive four word lines W0-W3, respectively. The first input of each NOR gate 611 is connected to the block row decoder 60 comprising an inverter 602 and a 3-input NOR gate 601. This gate 601 receives block pre-decoded signals BP0–BP2 which are generated by a pre-decoder (not shown) in response to seven bits of the row address information in the similar manner to that described with reference to FIG. 2. When all the signals BP0–BP2 take the low level, the output of the block decoder 60 is changed to the active low level to select the block 55-1. The remaining two bits of the row address information is used for selecting one of the four word lines W0–W3. Specifically, the different four combinations of the true and complementary levels of the two row address bits are supplied to four sub-decoders comprising NOR gates 550–553 and inverters 554–557 respectively, as shown. The output of the inverter 554 is supplied in common to the second inputs of the NOR gates 611-21 to 611-31, and for driving the word line W0. Similarly, the outputs of the inverters 555, 556 and 557 are supplied to the corresponding NOR gates 611 for driving the word lines W1-W3, respectively. Thus, when the output of the block decoder 60 takes the active low level and the inverter 554 also takes the active low level, the NOR gates 611-11, 611-21, 611-31 and 611-41 select and drive the word line W0 to the active high level simultaneously with one another. The word line W is thereby charged up to the high level in a short period of time.

Although the memory shown in FIGS. 1 and 2a and 2b and the memory shown in FIGS. 3 and 4 both drive each of the word lines at a high speed, the latter memory is advantageous in the number of circuit elements required than the former memory. More specifically, the memory of FIGS. 1 and 2 requires four inverters and four 3-input NAND gates every word line, and thus 16 inverters and 16 3-input NAND gates are required every four word lines. As a result, 64 N-channel transistors and 64 P-channel transistors are needed every four word lines, if each of the inverters and the 3-input NAND gates are constructed by a complementary MOS circuit. On the other hand, the memory of FIGS. 3 and 4 requires one 3-input NOR gate, one inverter and 16 2-input NOR gates every four word lines, and thus 36 N-channel transistors and 36 P-channel transistors in the case of constructing each gate by a complementary MOS circuit. Thus, the memory shown in FIGS. 3 and 4 are advantageous in both speed and the number of required circuit elements.

However, it is further desired to decrease in number the circuit elements without lowering the drive of each word line in order to further enhance the memory capacity.

SUMMARY OF THE INVENTION

It is therefore an object of the present invention to provide an improved semiconductor memory device.

It is another object of the present invention to provide a row decoder for a memory device in which required circuit elements are decreased in number.

It is still another object of the present invention to provide a row decoder for a memory device which drives each word line without increasing in number required circuit elements.

A row decoder according to the present invention is featured by including a plurality of decoding circuits each provided correspondingly to each of word lines and each having a first node supplied with a first control signal, which represents preferably selection or non-selection of a memory cell array block, a second node supplied with a second control signal, which represents preferably selection or non-selection of the corresponding word line contained in the one memory cell array block, a first transistor connected between the first node and the corresponding word line and turned ON when the second control signal takes an active level, and a second transistor connected between the corresponding word line and a reference potential terminal and turned ON when the second control signal takes an inactive level.

Thus, each of the decoding circuits can be constituted basically by two transistors to further save the number of required transistors.

BRIEF DESCRIPTION OF THE DRAWINGS

The above and other objects, advantages and features of the present invention will become more apparent form the following description taken in conjunction with the accompanying drawings, in which.

DETAILED DESCRIPTION OF THE INVENTION

Figure 1:
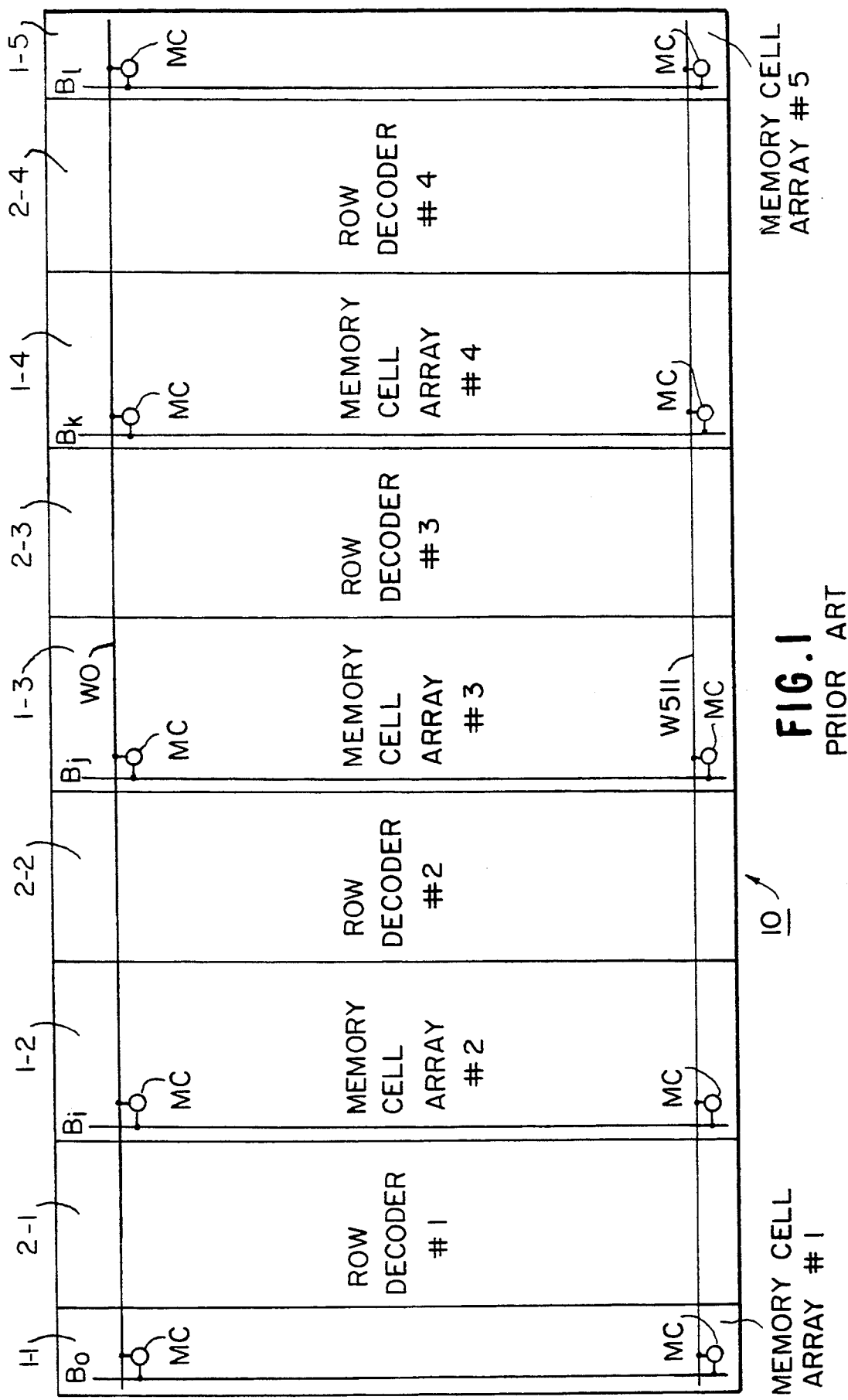
FIG. 1 is a block diagram illustrative of a memory cell array portion of a memory device according to a prior art.
Figure 2A:
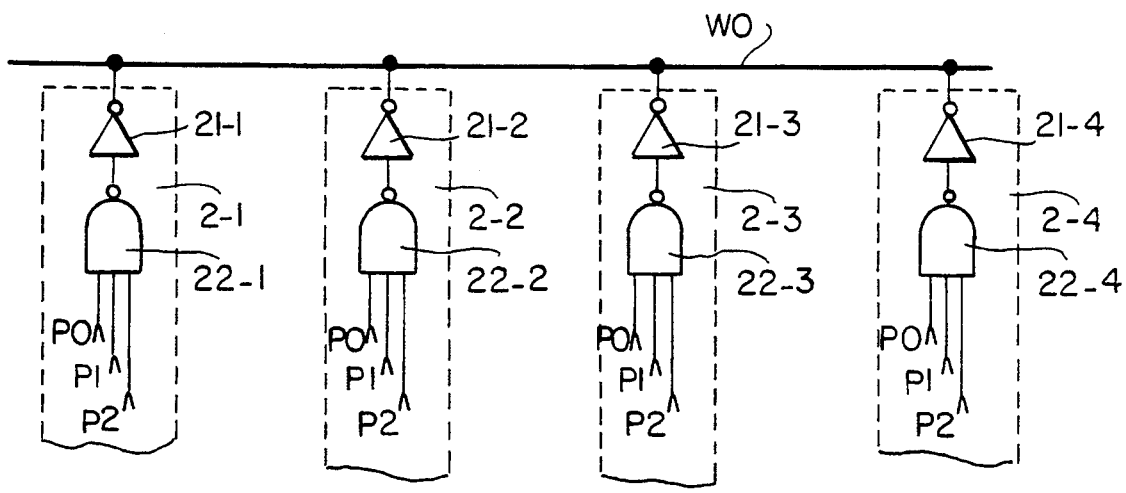
FIGS. 2a and 2b are circuit diagrams representative of a row decoder for a word line W0 shown in FIG. 1.
Figure 2B:
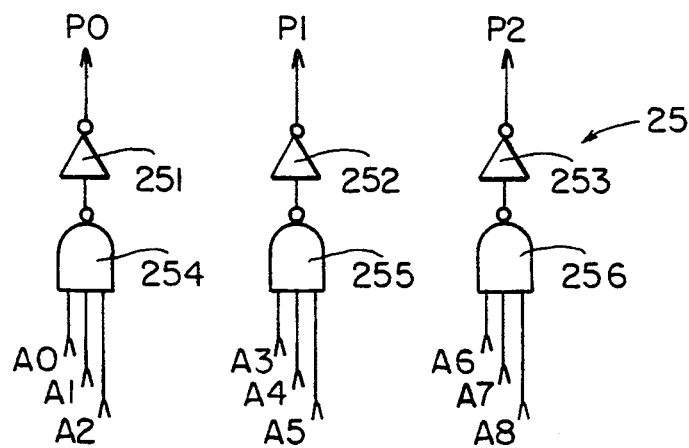
Figure 3:
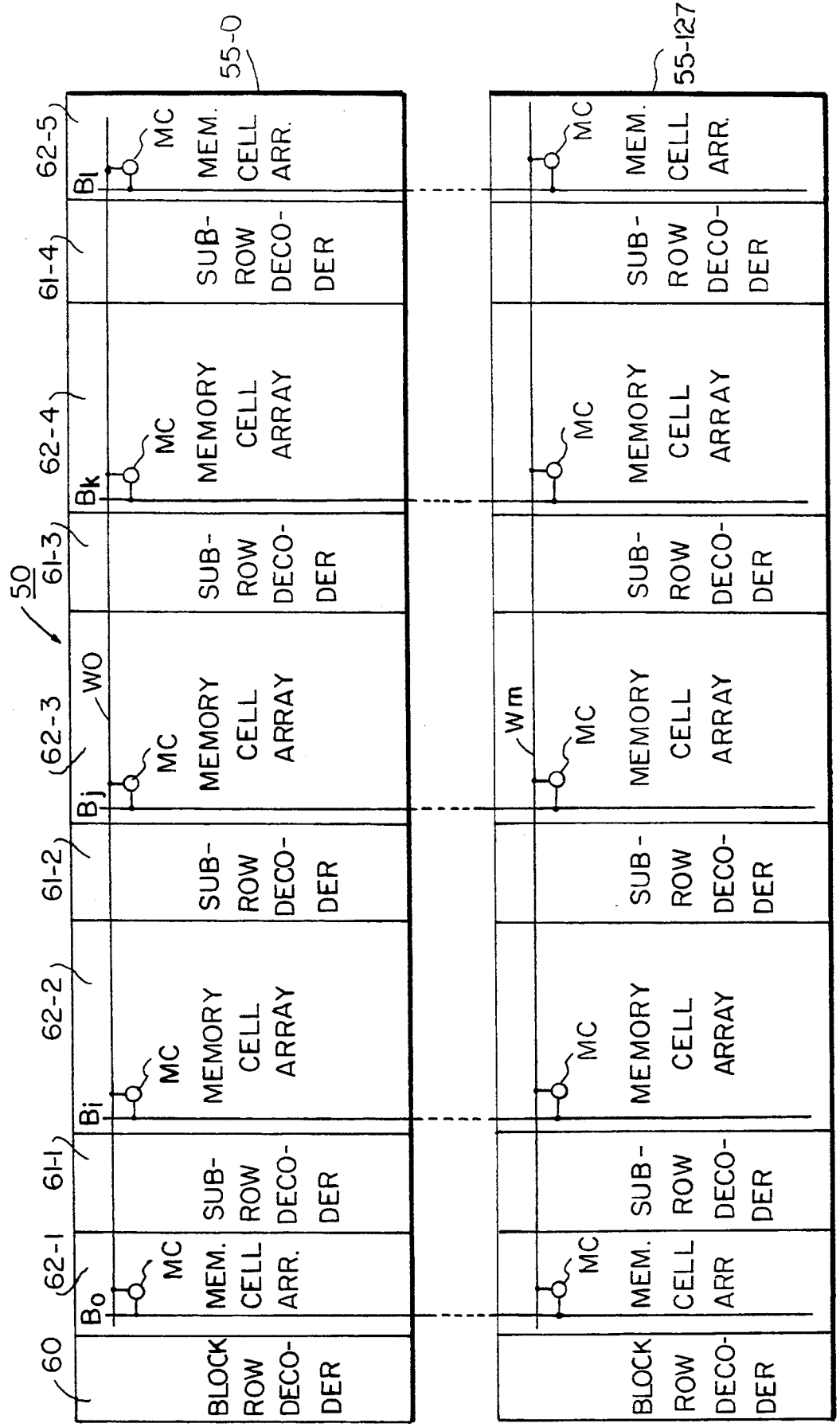
FIG. 3 is a block diagram illustrative of a memory cell array portion of a memory device according to another prior art.
Figure 5:
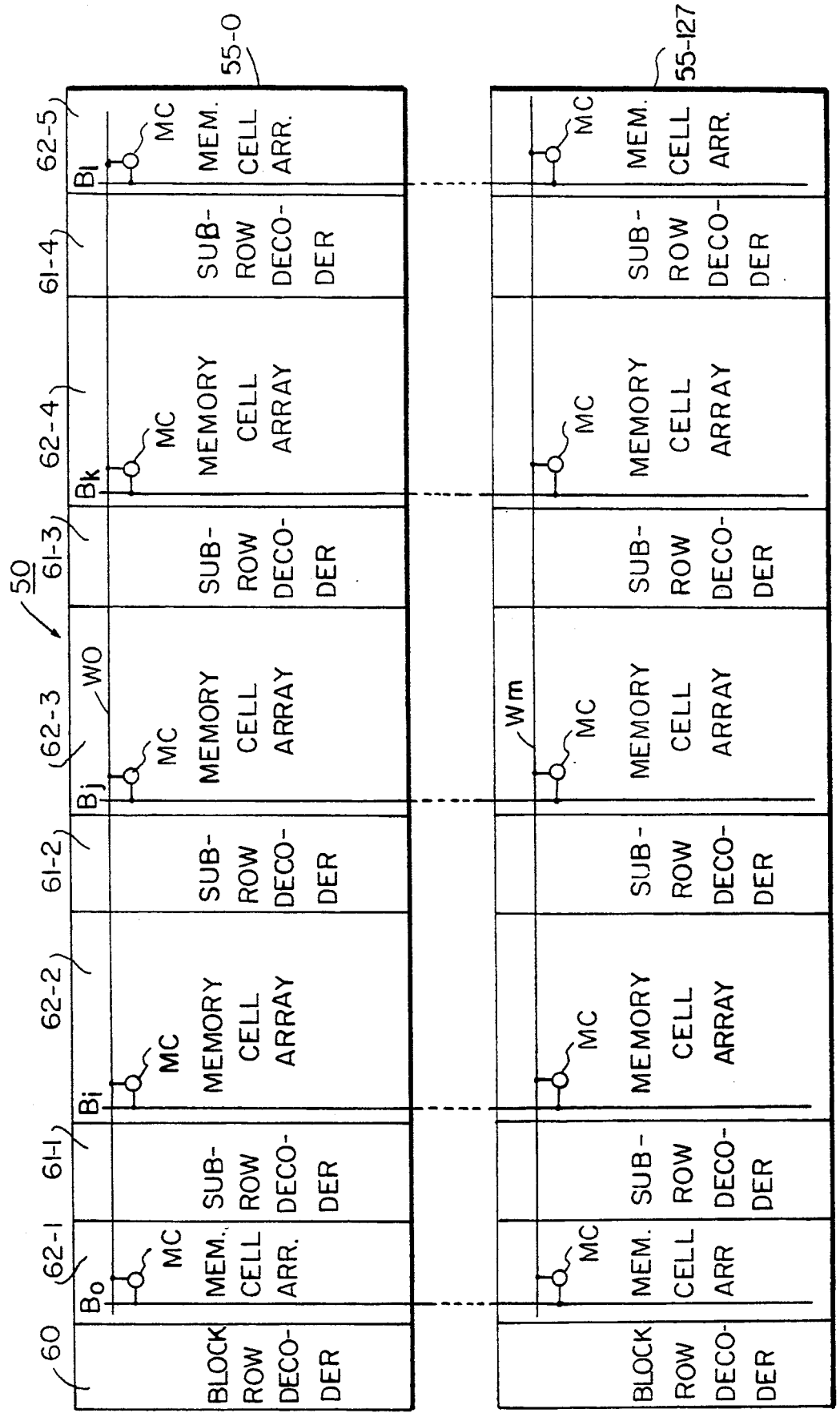
FIG. 5 is a block diagram illustrative of a memory cell array portion of a memory device according to the present invention.

Referring to FIG. 5, there is shown a memory cell array portion of a memory device according to the present invention. As apparent from the comparison between FIGS. 3 and 5, the present memory cell array portion is the same in block construction as that of FIG. 3, and therefore the further description thereof will be omitted by denoting the same reference numerals. However, the present is different in decoder construction from the prior art.

Figure 4:
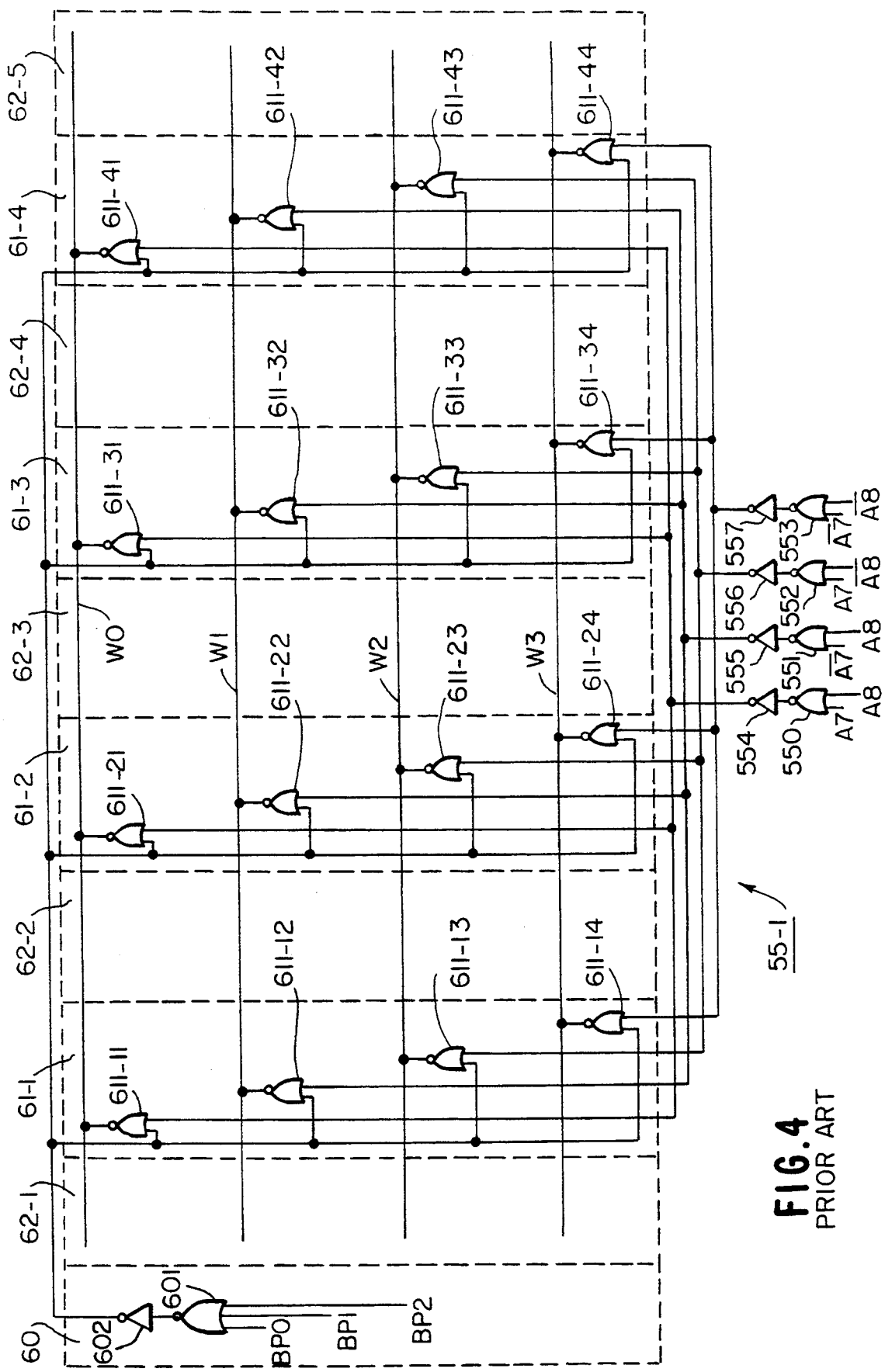
FIG. 4 is a circuit diagram representative of a row decoder of one memory cell array block shown in FIG. 3.
Figure 6:
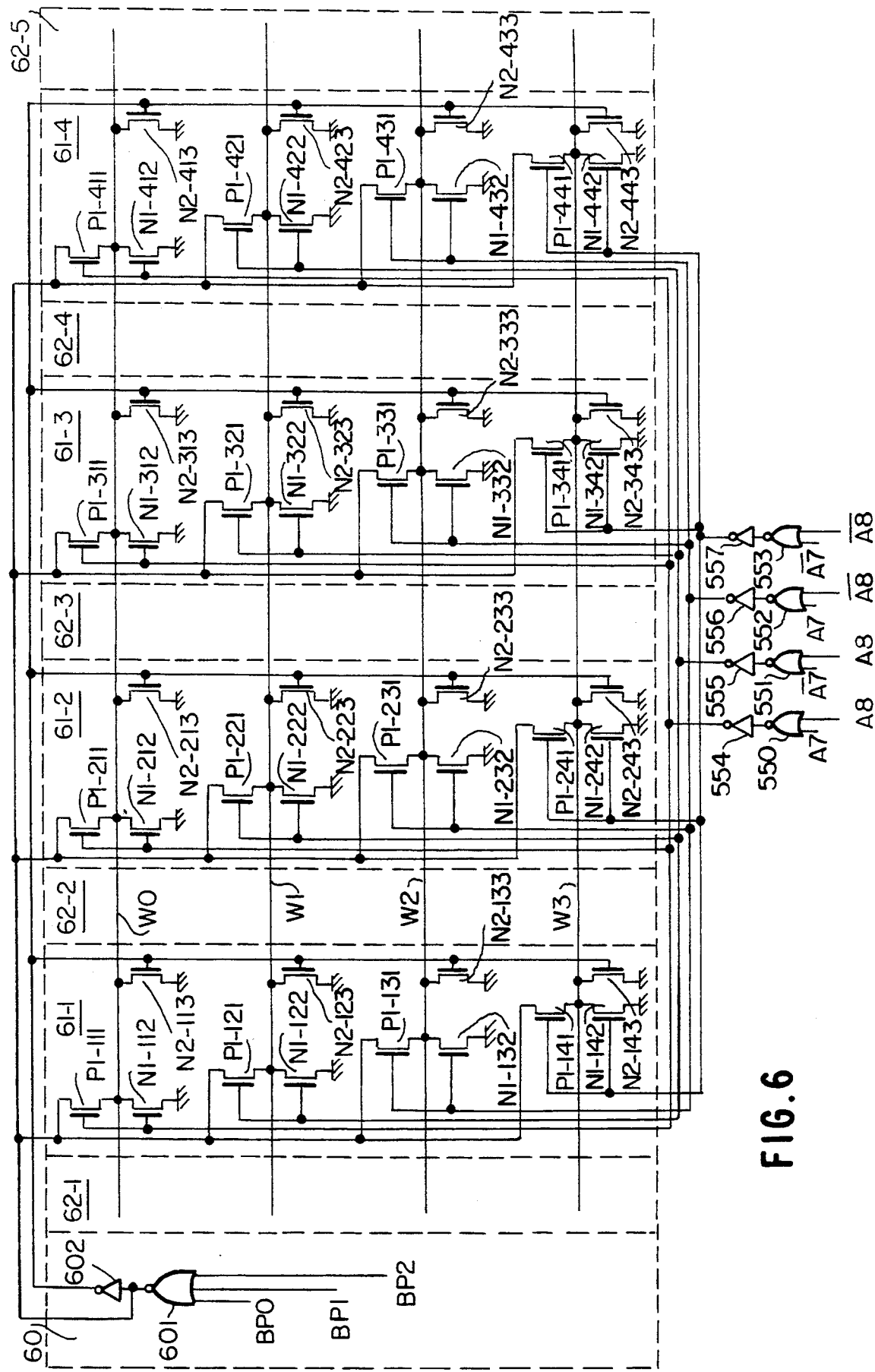
FIG. 6 is a circuit diagram representative of a row decoder of one memory cell array block shown in FIG. 5 in accordance with an embodiment of the present invention.

More specifically, as shown in FIG. 6, each of the NOR gates 611 shown in FIG. 4 is replaced by one P-channel transistor P1 and two N-channel transistors N1 and N2. The transistor P1 is connected between the output of the NOR gate 601 in the block row decoder 60 and the corresponding word line W and the transistor N1 is connected between the corresponding word line W and a ground terminal. The gates of the transistors P1 and N1 are connected in common to the corresponding one of the outputs of the inverters 554–557. The transistor N2 is connected between the corresponding word line W and the ground terminal and has its gate connected to the output of the inverter 602 in the block row decoder 60.

In operation, assume that the word line W0 is selected. In this case, all the pre-decoded block signals BP0–BP2 take the low level and each of the true levels of the address signals A7 and A8 also takes the low level. The NOR gate 601 thereby produces the high level and the inverter 554 produces the low level. The output of the inverter 602 is at the low level. Accordingly, the P-channel transistors P1 connected to the word line W0 are turned ON, whereas the N-channel transistors N1 connected to the word line W0 are turned OFF. The transistors N2 connected to the word line W0 are held in non-conductive state. The word line W0 is thus selected and driven to the active high level. Moreover, the word line W0 is driven at four points thereof and is thus charged up to the high level in a short period of time.

Assuming that at least one of the row address signals A0–A6 (not shown) changes in level thereof to select another memory cell array block, the output of the NOR gate 601 is changed to the low level, whereas the output of the inverter 602 is changed to the high level. The P-channel transistors P1 thereby discharge the word line W0. The transistors N2 are also turned ON to discharge the word line W0. The word line W0 is thus discharged to the low level at a high speed. When the level of the word line W0 becomes smaller than the threshold level of the P-channel transistors P1, the transistors P1 are turned OFF. The word line W0 is thereafter discharged by the transistors N2.

In the case of changing only the level of the address signal A7 or A8, the output of the inverter 554 is changed to the high level. As a result, the transistors P1 are turned OFF, whereas the transistors N1 are turned ON to discharge the word line W0. One of the outputs of the inverters 555–557 is in turn changed to the low level to select and drive one of the word lines W1–W3 to the active high level.

According to the present memory device, 16 MOS transistors are saved every four word lines, as compared to that of FIG. 4. The memory cells MC are increased in number accordingly. Moreover, the high speed drive of each word line is performed.

Figure 7:
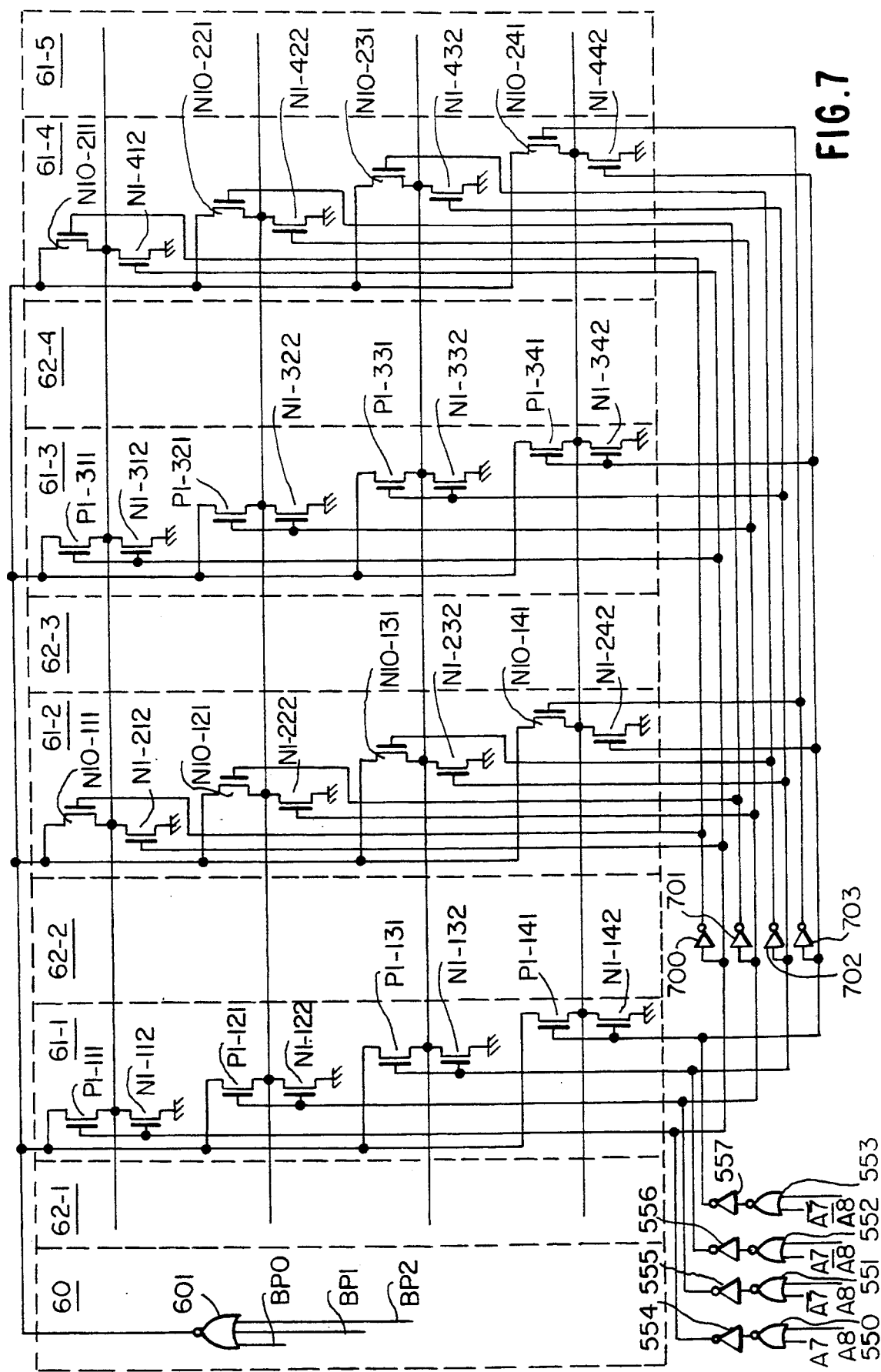
FIG. 7 is a circuit diagram representative of a row decoder of one memory cell array block shown in FIG. 5 in accordance with another embodiment of the present invention.

Turning to FIG. 7, there is shown another embodiment of the present invention, in which the same constituents as those shown in FIG. 6 are denoted by the same reference numerals to omit the further description thereof. In this embodiment, all the transistors N2 and the inverter 602, which are required in the circuit of FIG. 6, are omitted. Further, the P-channel transistors P1 in the sub-row decoder 61-2 and 61-4 are replaced by N-channel transistors N10. Furthermore, there are provided four inverters 600–603 to invert the outputs of the inverters 554–557 respectively. The gate of each of the transistors N10 is connected to the corresponding one of the outputs of the inverters 700–703. If desired, the inverters 700–703 may be omitted, and the outputs of the NOR gates 550–553 may be used, instead.

When all the pre-decoded block signals BP0–BP2 take the low level and each of the address signals A7 and A8 also takes the low level, the P-channel transistors P1 connected to the word line W0 are turned ON to drive it. The N-channel transistors N10 connected to the word line W0 are also turned ON to charge it. Moreover, the word line W0 is driven at four points thereof. Thus, the level of the word line W0 is changed toward to the high level quickly. When the level of the word line W0 becomes smaller than the threshold level of the N-channel transistor, the transistors N10 are turned OFF. The word line W0 is thereafter charged up to the high level by the transistors P1.

When at least one of the row address signals A0–A6 changes in its level to select another cell block, the output of the NOR gate 601 is changed to the low level. The word line W0 is thereby discharged by the transistors P1 and N10. Although the transistors P1 are turned OFF by the level of the word line W0 becoming smaller than the threshold level thereof, the transistors N10 are held in the conductive state to discharge the word line W0 up to the low level.

In the case of changing the level of the signal A7 or A8, the transistors P1 and N10 are turned OFF, whereas the transistors N1 are turned ON to discharge the word line W0 to the low level. Another word line is in turn selected and driven to the active high level in the manner as described hereinbefore.

According to the present memory device, 18 transistors are further saved every four word lines, as compared to that of Fig. 6. Although four inverters 700–703 are needed, these inverters are used in common for all the cell blocks 55, so that there is no substantial increase in number of the circuit elements. Moreover, the inverters 700–603 may be omitted, as described hereinbefore.

It is apparent that the present invention is not limited to the above embodiments but may be modified and changed without departing from the scope and spirit of the invention.

What is claimed is:

1. A semiconductor memory device comprising a plurality of word lines and a row decoder for selecting one of said word lines, said row decoder including a plurality of decoding circuits provided correspondingly to each of said word lines, each of said decoding circuits driving a corresponding word line to one of energizing and non-energizing levels in response to first and second control signals and including a first node supplied with said first control signal, a second node supplied with said second control signal, a first transistor connected between said first node and said corresponding word line and having a gate connected to said second node, a second transistor connected between said corresponding word line and a reference potential terminal and having a gate connected to said second node, a third transistor connected between said first node and said corresponding word line in parallel to said first transistor and having a channel type opposite to the channel type of said first transistor, said third transistor receiving at a gate thereof an inverted signal of said second control signal, said first and third transistors being turned ON when said second control signal takes an active level and said second transistor being turned ON when said second control signal takes an inactive level, wherein each of said decoding circuits further includes a fourth transistor connected between said corresponding word line and said reference potential terminal in parallel to said second transistor and having a gate connected to said second node, said fourth transistor being turned ON when said second control signal takes said inactive level.

2. The memory device as claimed in claim 1, wherein each of said second and fourth transistors has a channel type that is opposite to the channel type of said first transistor.

3. A semiconductor memory device comprising a plurality of memory cell array blocks, each of said memory cell array blocks including a plurality of word lines, a block row decoder and a sub-row decoder, said block row decoder producing a first control signal taking an active level when a corresponding memory cell array block is selected and an inactive level when another memory cell array block is selected, each of said sub-decoder including a plurality of decoding circuits each provided correspondingly to each of said word lines supplied with said first control signal, a second control signal representative of one of selection and non-selection of a corresponding word line and a third control signal that is an inverted signal of said second control signal, each of said decoding circuits having a first node supplied with said first control signal, a second node supplied with said second control signal, a third node supplied with said third control signal and at least first and second driving circuits cooperating with each other to drive the corresponding word line, said first driving circuit including a first transistor of one channel type connected between said first node and the corresponding word line and having a gate connected to said second node and a second transistor of an opposite channel type connected between said corresponding word line and a reference potential terminal and having a gate connected to said second node, said second driving circuit including a third transistor of said opposite channel type connected between said first node and said corresponding word line in parallel to said first transistor and having a gate connected to said third node and a fourth transistor of said opposite channel type connected between said corresponding word line and said reference potential terminal in parallel to said second transistor and having a gate connected to said second node.

4. The memory device as claimed in claim 3, wherein each of one channel type is a P-channel type and said opposite channel type is an N-channel type.

* * * * *

UNITED STATES PATENT AND TRADEMARK OFFICE
CERTIFICATE OF CORRECTION

PATENT NO.   : 5,394,375
DATED        : February 28, 1995
INVENTOR(S)  : Shinichi Iwashita It is certified that errors appears in the above-identified patent and that said Letters Patent is hereby corrected as shown below:

Col. 1, line 47 delete "254 - 256" insert --251 - 253--

Col. 1, line 48 delete "253 - 255" insert --254 - 256-- (both occurrences)

Col. 1, line 68 after "arrays" insert --62-1 to 62-5--

Col. 2, line 21 after "gates" delete "611-21 to 611-31" insert --611-11, 611-21, 611-31, and 611-41--

Col. 4, line 55 delete "600-603" insert --700 - 703--

Col. 5, line 27 delete "700 - 603" insert --700 - 703--

Signed and Sealed this

Thirteenth Day of June, 1995

Attest:

BRUCE LEHMAN

Attesting Officer

*Commissioner of Patents and Trademarks*